United States Patent
Wang et al.

(10) Patent No.: US 10,421,571 B2
(45) Date of Patent: Sep. 24, 2019

(54) SYSTEM FOR SENSING ELEMENT ADJUSTMENT AND MATERIAL BELT DETECTION

(71) Applicant: An-Sung Wang, New Taipei (TW)

(72) Inventors: An-Sung Wang, New Taipei (TW); Ching-Chang Wong, New Taipei (TW); Yang-Han Lee, New Taipei (TW)

(73) Assignee: An-Sung Wang, New Taipei (TW)

( * ) Notice: Subject to any disclaimer, the term of this patent is extended or adjusted under 35 U.S.C. 154(b) by 655 days.

(21) Appl. No.: 15/081,954

(22) Filed: Mar. 28, 2016

(65) Prior Publication Data

US 2017/0275034 A1    Sep. 28, 2017

(51) Int. Cl.
| | |
|---|---|
| *H01L 21/67* | (2006.01) |
| *B65H 16/04* | (2006.01) |
| *B65B 57/04* | (2006.01) |
| *B65B 15/04* | (2006.01) |

(52) U.S. Cl.
CPC ............ *B65B 57/04* (2013.01); *B65B 15/04* (2013.01); *B65H 16/04* (2013.01); *H01L 21/67126* (2013.01)

(58) Field of Classification Search
CPC ...... B65H 16/02; B65H 16/04; B65H 19/123; B65H 2301/413; B65H 2301/4132
USPC .................................................. 242/398, 597
See application file for complete search history.

(56) References Cited

U.S. PATENT DOCUMENTS

| | | | | |
|---|---|---|---|---|
| 540,649 | A * | 6/1895 | Eastwood | B65H 75/06 242/537 |
| 2,280,573 | A * | 4/1942 | Flaws, Jr. | B65H 75/22 140/71.5 |
| 2,341,957 | A * | 2/1944 | Storey | B65H 16/04 236/48 R |
| 2,558,055 | A * | 6/1951 | Meredith | B21C 47/28 242/575 |
| 2,995,968 | A * | 8/1961 | Tomberg | B26D 5/34 226/38 |
| 3,411,767 | A * | 11/1968 | Moser | B26D 5/32 270/37 |
| 3,762,617 | A * | 10/1973 | Matthis | B65B 41/18 226/157 |
| 3,861,983 | A * | 1/1975 | Harrell | B29C 65/02 156/359 |

(Continued)

*Primary Examiner* — Thanh K Truong
*Assistant Examiner* — Patrick B Fry
(74) *Attorney, Agent, or Firm* — Leong C. Lei

(57) ABSTRACT

A system for sensing element adjustment and material belt detection comprises a machine body, adjustable clamping device, material disk and sensing system. The adjustable clamping device being configured on a material belt of said machine body, an adjustable plate being configured on an adjusting element of a main body of the adjustable clamping device, and an adjustable rod being configured on the adjustable plate allow forming a triangle pivot support with two fixing rods of the main body. Furthermore, an elastic element is configured between the adjustable plate and main body to allow the adjustable plate to drive the adjustable rod to achieve an elastic adjustment support in such a way to allow the mounting of the material disks of different hole diameters through the adjustable rod. Furthermore, a material belt detection device of the present invention may detect the material belt stably and effectively.

10 Claims, 11 Drawing Sheets

(56) References Cited

U.S. PATENT DOCUMENTS

| | | | | |
|---|---|---|---|---|
| 4,354,337 A | * | 10/1982 | Mori | H05K 13/0038 |
| | | | | 53/558 |
| 4,441,531 A | * | 4/1984 | Umezawa | D03D 47/363 |
| | | | | 139/452 |
| 4,680,205 A | * | 7/1987 | Lerner | B65B 41/18 |
| | | | | 226/45 |
| 4,705,227 A | * | 11/1987 | Honegger | B65H 29/006 |
| | | | | 242/528 |
| 5,176,333 A | * | 1/1993 | Stauber | B65H 29/006 |
| | | | | 242/528 |
| 5,657,935 A | * | 8/1997 | Cooper | B65H 57/20 |
| | | | | 242/128 |
| 5,673,869 A | * | 10/1997 | Honegger | B65H 5/28 |
| | | | | 242/528 |
| 6,481,187 B1 | * | 11/2002 | Behnke | B07C 5/02 |
| | | | | 53/250 |
| 2004/0011915 A1 | * | 1/2004 | Korthauer | B65C 9/1869 |
| | | | | 242/563.1 |

\* cited by examiner

SYSTEM FOR SENSING ELEMENT ADJUSTMENT AND MATERIAL BELT DETECTION

TECHNICAL FIELD OF THE INVENTION

The present invention relates to a system for sensing element adjustment and material belt detection, and more particularly to a system, having an adjusting plate and adjusting rod adapted to achieve triangle pivot support with two fixing rods of a main body, and an elastic element between the adjusting plate and main body further allowing the adjusting plate to drive the adjusting rod to adjusting the support elastically in such a way that material disks of different hole diameters can be mounted through the adjusting rod, and the material belt can be operated stably through the material belt detection device.

DESCRIPTION OF THE PRIOR ART

In the general chip packaging, chips are placed in a hard plastic material belt, and then sealed with a sealing film, which are mostly completed by means of automatic packaging; the general way of packaging is: inputting a roll of material belt with a plurality of receiving holes from one side of an automatic chip packaging machine; pushing the material belt forward continuously by poking ratchet holes configured on one side of the material belt to move when the ratchet on one side of the automatic chip packaging machine is rotated; placing chips one by one into the receiving holes of the material belt manually or through an automatic feeding device; and sealing the outer side of the material belt with a sealing film to accommodate chips in the receiving holes after the seal film is rolled by a press wheel if the chips being placed at the correct positions is confirmed by the scanning of detectors, thereby providing the protection and accommodation of the chips from being damaged and dropped out.

However, transmission power sources of such kinds of chip packaging machines always is more than one motor for the sufficient provision of the power; the motor is mostly respectively configured at the transmission point of the material belt and the receipt roll. The motors are always fixed to one side of the machine body, causing the machine to have an uneven external shape, which not only is easy to be collided but occupies large space and is rather unsightly in shape.

To solve the disadvantages mentioned above, Taiwan Patent No. M359799 proposes a chip packaging machine, including a long machine body, one side of which is configured longitudinally with a guide groove; the two ends of the machine body are respectively configured along the an extending shelf, on which an axial shaft is configured, where the guide groove on the machine body is mainly defined by one side wall of the machine body and a movable plate opposite to each other. Furthermore, two sets of screw rods and spinning rods spaced relatively are respectively configured on the side wall, where the screw rods are passed through and adapted to screw the movable plate and can be rotated to drive the movable plate to adjust the width of the guide groove, and the spinning rods are passed through one side wall of the machine body and respectively configured with a ratchet wheel at the position of the guide groove. Furthermore, two motors for material belt transmission and material belt collection are configured skillfully inside the machine body, allowing the projecting objects such as the motors are not exposed so as to decrease the volume and increasing the safety of plants. In addition, the transmission mechanism inside the machine body uses the skillful collocation of components such as the screw rod, spinning rod, transmission belt and ratchet wheel to link the two spinning rods to the transmission belt to allow them to be affect relatively, making the two ratchet wheels controlling the advance of the material belt become power components to transmit the front, back ends of the material belt with them, allowing the material belt to be advanced more smoothly.

Although the ratchet wheels of the chip packaging machine mentioned above allow the material belt to be advanced more smoothly through the ratchet holes, level inequality or about displacement of the material belt is caused easily due to the bad mounting positions or different rotating speeds of the feeding disk and collecting disk, resulting in the incomplete film sealing of the material belt and the easy error due to the level inequality and about displacement of the material belt upon the detection of the material belt. Furthermore, general material disks all are passed through with the axial shafts and then fixed with the fixing elements so as to be clamped and stabilized. But, the material disks must be mounted with complicated fixing elements, and the axial shafts and fixing element of different sizes must be used for material disks with a different hole diameter upon the replacement thereof, resulting in the defects of time consuming and low efficiency.

SUMMARY OF THE INVENTION

To overcome the disadvantages mentioned above, one object of the present invention is to provide a system for sensing element adjustment and material belt detection, having an adjustable clamping device configured on material belt detection device of a machine body thereof, an adjusting plate configured on an adjusting element of the machine body of the adjusting clamping device, and an adjusting rod configured on the adjusting plate in such a way to from a triangle pivot support with two fixing rod of the main body. Furthermore, an elastic element is configured between the adjusting plate and main body so as to allow the adjusting plate to drive the adjusting rod to adjust the support elastically, thereby mounting material disks of different hole diameters through the adjusting rod. Furthermore, the present invention further has a material belt detection device, capable of achieving the stable detection operation of the material belt.

To achieve the object mentioned above, the present invention proposes a system for sensing element adjustment and material belt detection, including:

a machine body, configured with a material conveying platform having a feeding end and collecting end, the machine body having a material detection device, collecting disk positioned on the collecting end, and feeding disk positioned on the feeding end;

an adjustable clamping device, configured on a preset position of the machine body, and having a main body, one side of the main body being indented with a notch, the main body being configured with an adjusting groove positioned at one side of the notch, the main body being configured with a first a first positioning rod positioned at one side of the adjusting groove, the main body being fixed with two fixing rods positioned at two respective corresponding sides of the notch, an adjusting element being coupled pivotally to said main body, the adjustable element being configured with an adjusting plate, one end of the adjustable plate being configured with an adjustable rod positioned and movable inside the notch for adjustment, another end of the adjusting rod being coupled pivotally to the main body with a locking element, one side of the adjusting plate being configured with a second positioning rod having an elastic element, one end of the elastic element, one end of the elastic element being in connection with the positioning rod, and another end of the elastic element being connection with the first positioning rod;

a material disk, configured on the adjustable clamping device, the material disk having a through hole allowing the adjustable rod and each fixing rod of the adjustable clamping device to be passed through;

a sensing system, configured on one face of the material conveying platform, first, second, third and fourth sensing elements being configured inside the sensing system, the first and second sensing elements being positioned on the collecting end of the material conveying platform, and the third and fourth sensing elements being positioned on the feeding end thereof.

a cooling module, configured on the material conveying platform, and preferably between the second and third sensing elements.

DETAILED DESCRIPTION OF THE PREFERRED EMBODIMENTS

Figure 2:
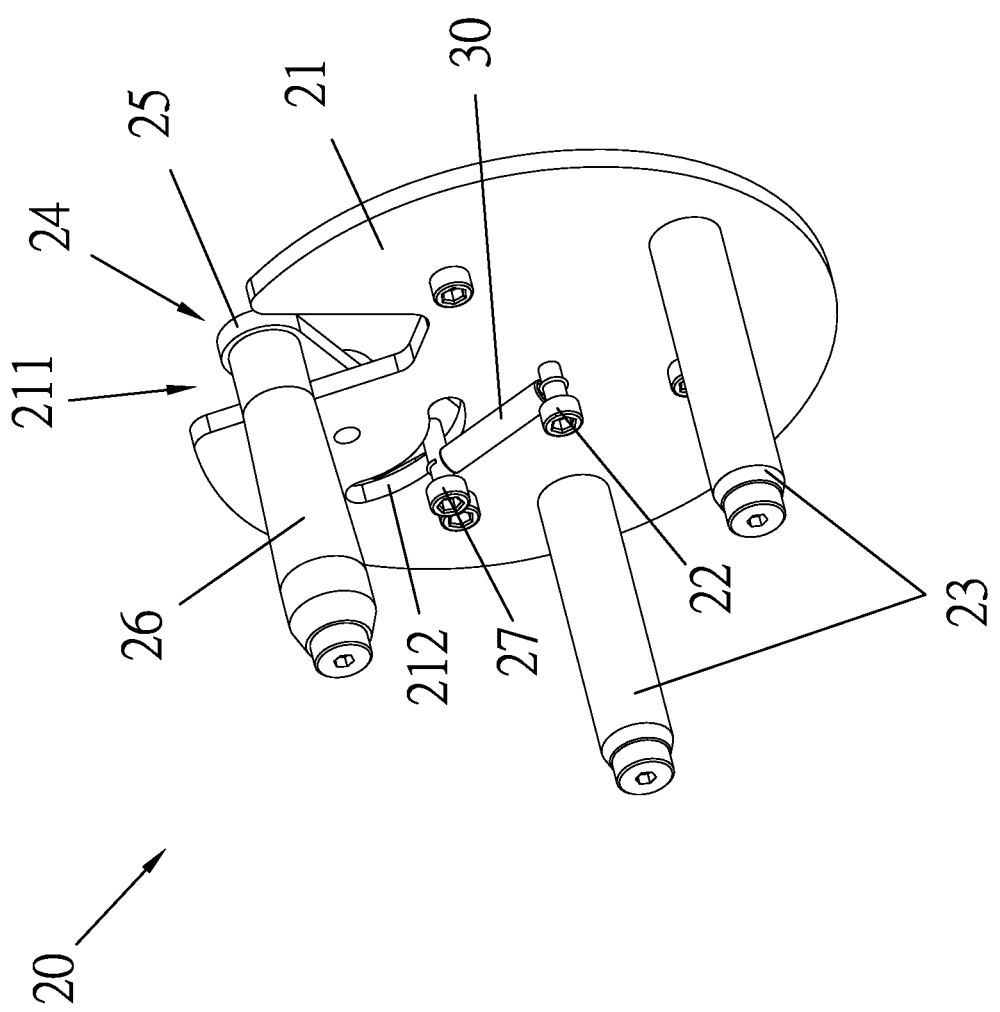
FIG. 2 is a schematically perspective view of an adjustable clamping device according to the present invention.
Figure 3:
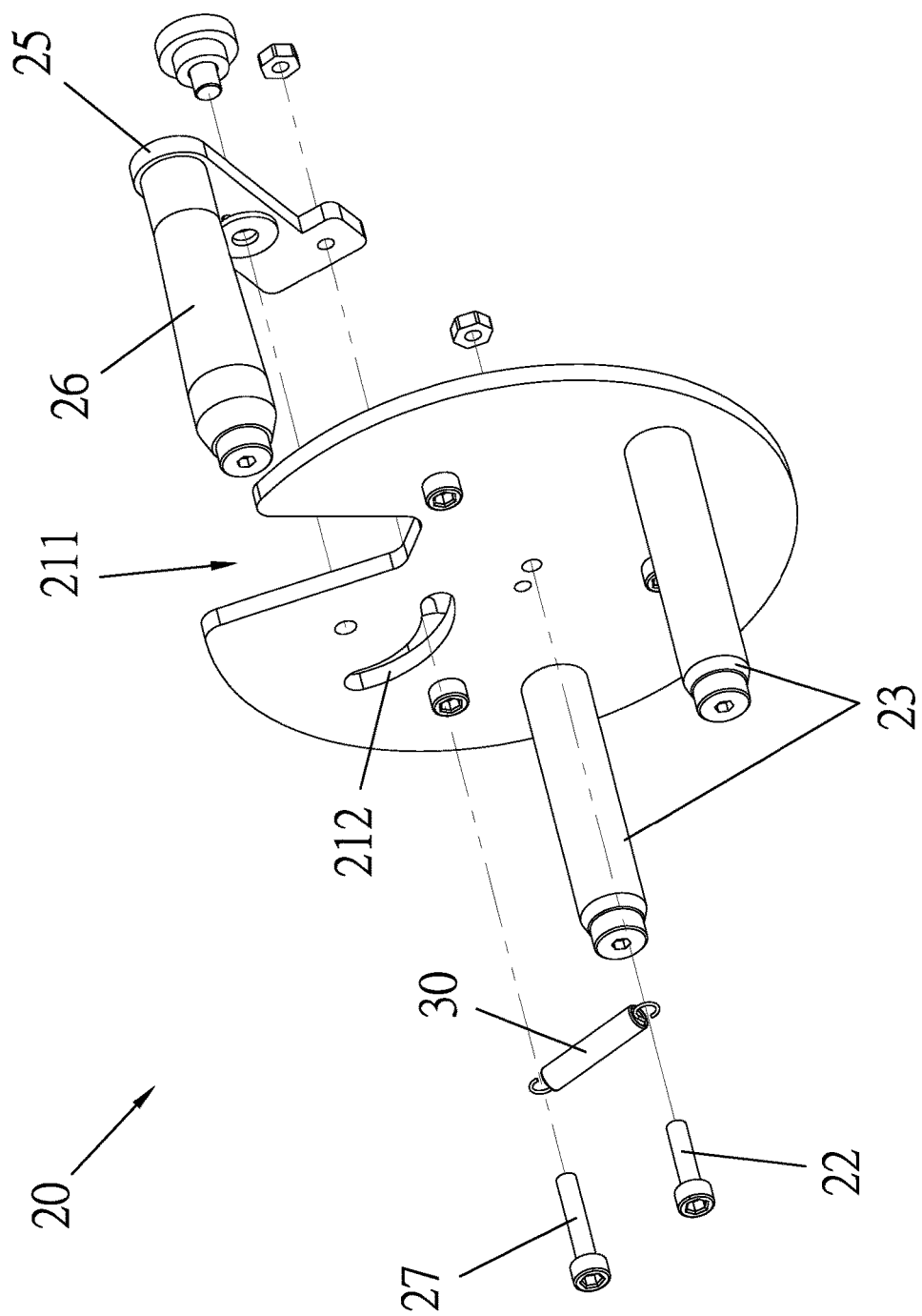
FIG. 3 is an exploded view of the adjustable clamping device according to the present invention.
Figure 6:
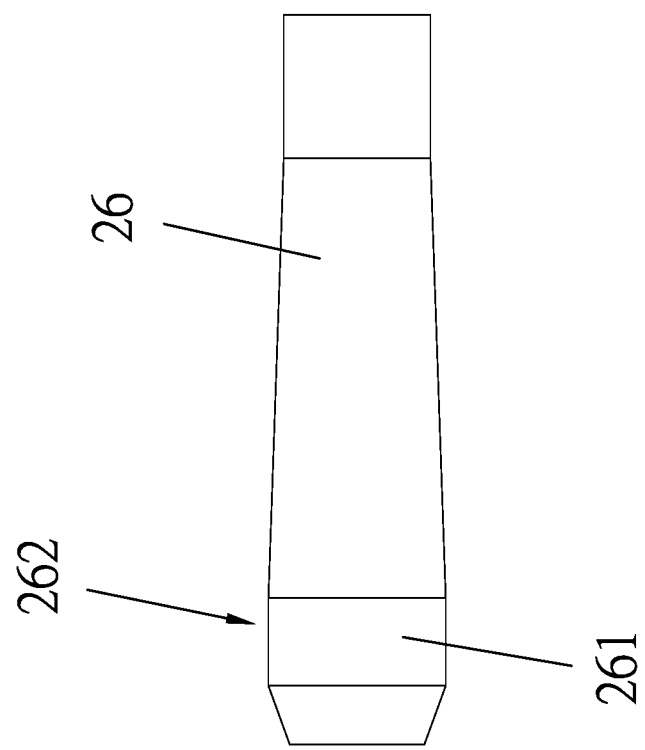
FIG. 6 is schematic enlarged view of an adjusting rod having an inclined angle according to the present invention.

Referring to FIGS. 2 and 3, equipment for sensing element adjustment and material belt detection and an adjustable clamping and fixing device of the present invention includes:

an adjustable clamping device 20, configured with a main body 21, one side of which is indented with a notch 211; the main body 21 is configured with an adjusting groove 212 which may be positioned at one side of the notch 211, a first positioning rod 22 which may be positioned at one side of the adjusting groove 212, and two fixing rods 23 which positioned at two sides of the notch 211. Furthermore, an adjusting element 24 having an adjusting plate 25 is coupled pivotally to the main body 21, the one end of the adjusting plate 25 being configured with an adjusting rod 26 positioned in the notch 211 and movable in the notch 211 for the adjustment; another end of the adjusting plate 25 is coupled to the main body 21 with a locking element 251; one side of the adjusting plate 25 is configured with a second positioning rod 27 coupled to an elastic element 30, one end of elastic element 30 being in connection with the second positioning rod 27, and another end thereof the first positioning rod 22;

where the two sides of the notch 211 may further have an inclined angle, respectively, and may be a U-shaped cut;

where the adjusting groove 212 is curved, and may be a C-shaped curve;

where the adjusting plate 25 may be a long-striped body;

where the adjusting rod 26 has a head end 261 having an inclined angle 262 with the adjusting rod 26, the inclined angle 262 being in the range from 3 to 8 degrees, as FIG. 6 show.

Figure 4:
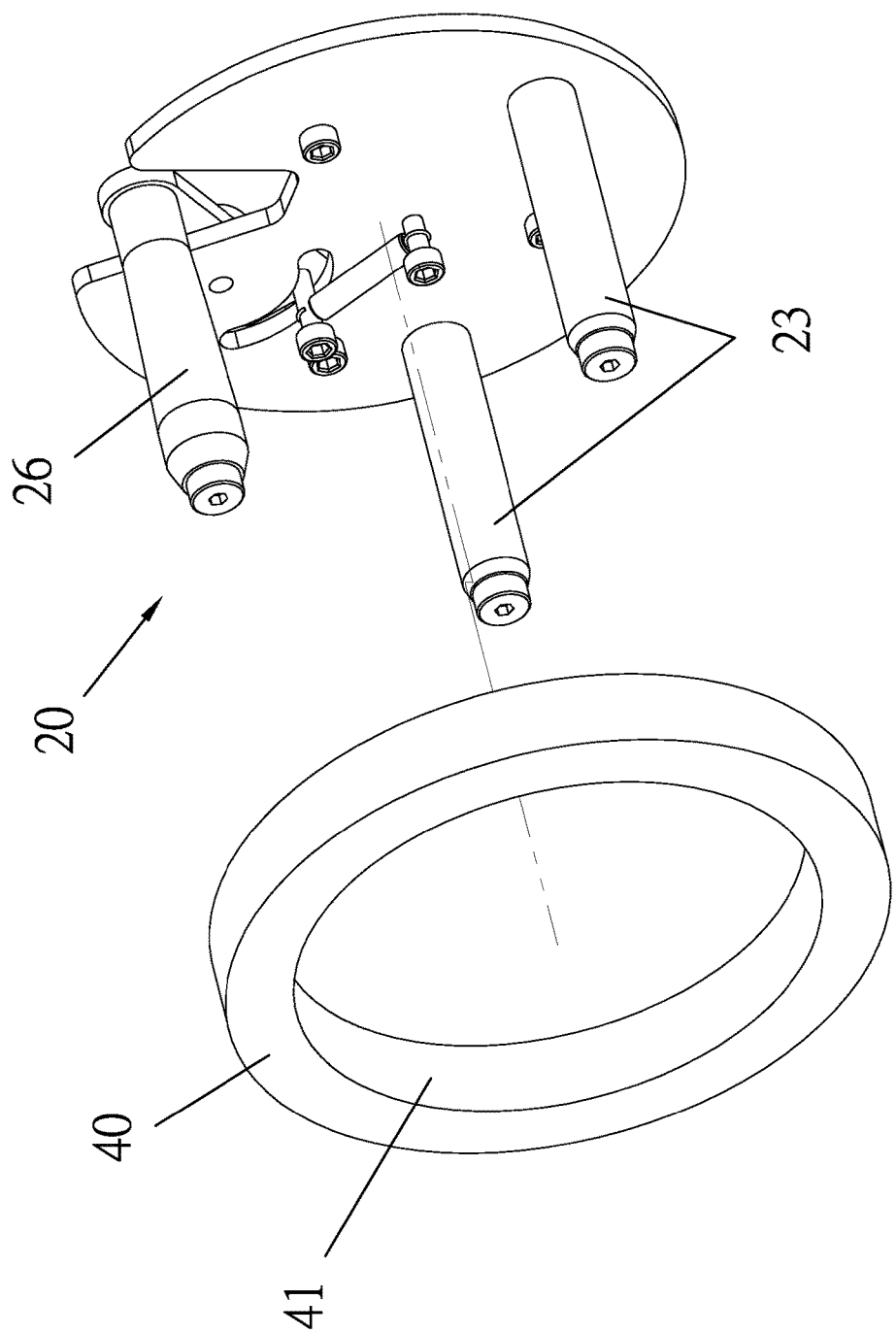
FIG. 4 is a schematically exploded view of the adjustable clamping device together with a material disk according to the present invention.

Referring to FIG. 4, the adjusting clamping device 20 of the present invention is allowed to pass through and clamp a material disk 40; the material disk 40 can be mounted on the adjustable clamping device 20; the material disk 40 is configured with a through hole 41 which may allow the adjusting rod 26 and each fixing rod 23 to be passed through the adjustable clamping device 20.

Figure 5:
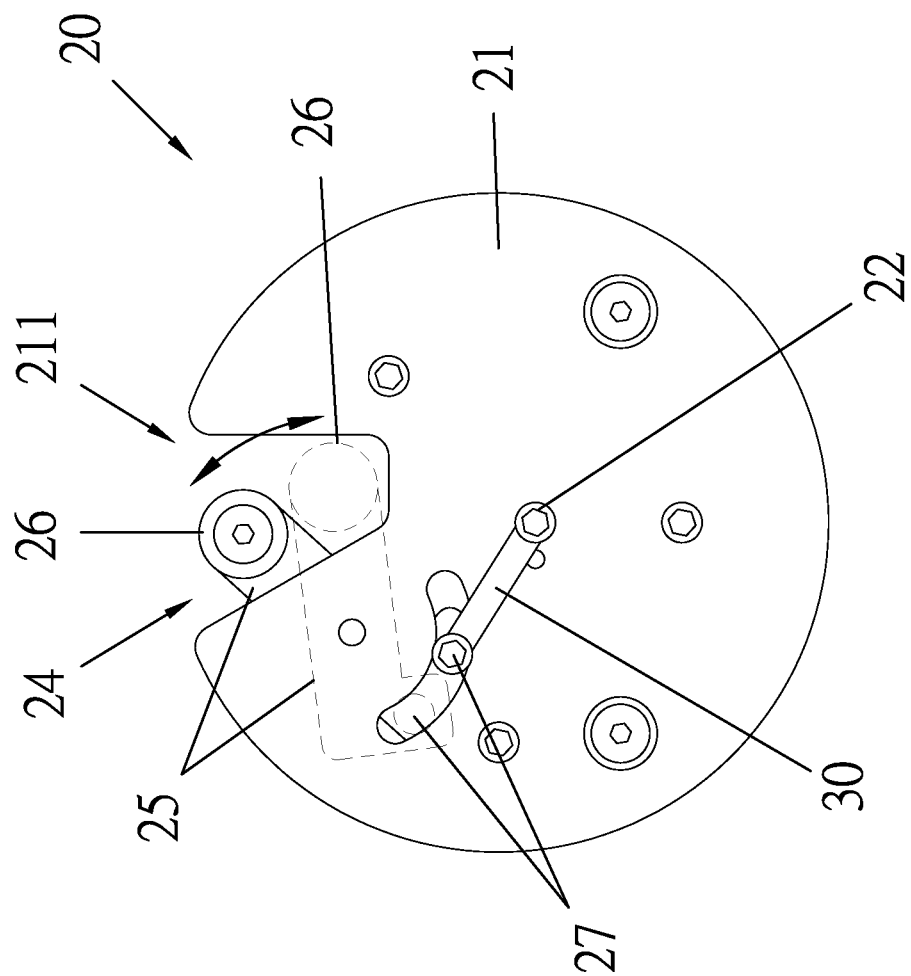
FIG. 5 is a schematic view of the adjustable clamping device of the present invention upon adjustment.

Furthermore, referring to FIG. 5 again, the adjustable clamping device 20 is configured with the adjusting element 24, one end of the adjustable plate 25 of the adjustable element 24 the adjusting rod 26. and the fixing rod 23 is respectively at the opposite sides of the notch 211 of the main body 21 in such a way that a user can adjust the displacement in the notch 211 of the main body 21 through the elastic element 30, and form a triangle pivot support through the two fixing rods 23 and adjusting rod 26 configured on the main body 21 when pressing the adjusting rod 26 by configuring the elastic element 30 on the second positioning rod 27 on one side of the adjusting plate 25, and connecting one end of the elastic element 30 to the second positioning rod 27 and another end of the elastic element 30 to the first positioning rod 22 of the main body 21 when the user wants to mount the material disk 40 onto the adjustable clamping device 20, thereby allowing the material disks 40 of the through holes 41 of different diameters to be clamped, fixed and supported effectively. Furthermore, the adjusting rod 27 being configured with the head end 261 can prevent the material disk 40 from being separated and dropped out. In other words, a user can adjust the adjusting rod 26 to allow the best mounting situation of the material disk 40 depending on use requirements while mounting the material disk 40, and the elastic support of the adjusting element 24 and adjusting rod 26 through the reverse force of the elastic element 30, and further to strengthen the stable positioning of the material disk 40. In addition, the head end 261 of the adjusting rod 261 having the inclined angle 262 which is preferably in the range from 3 to 8 degrees can prevent the material disk 40 from sliding outward upon rotation, and further prevent the material disk 40 from being separated and dropped out.

Figure 1:
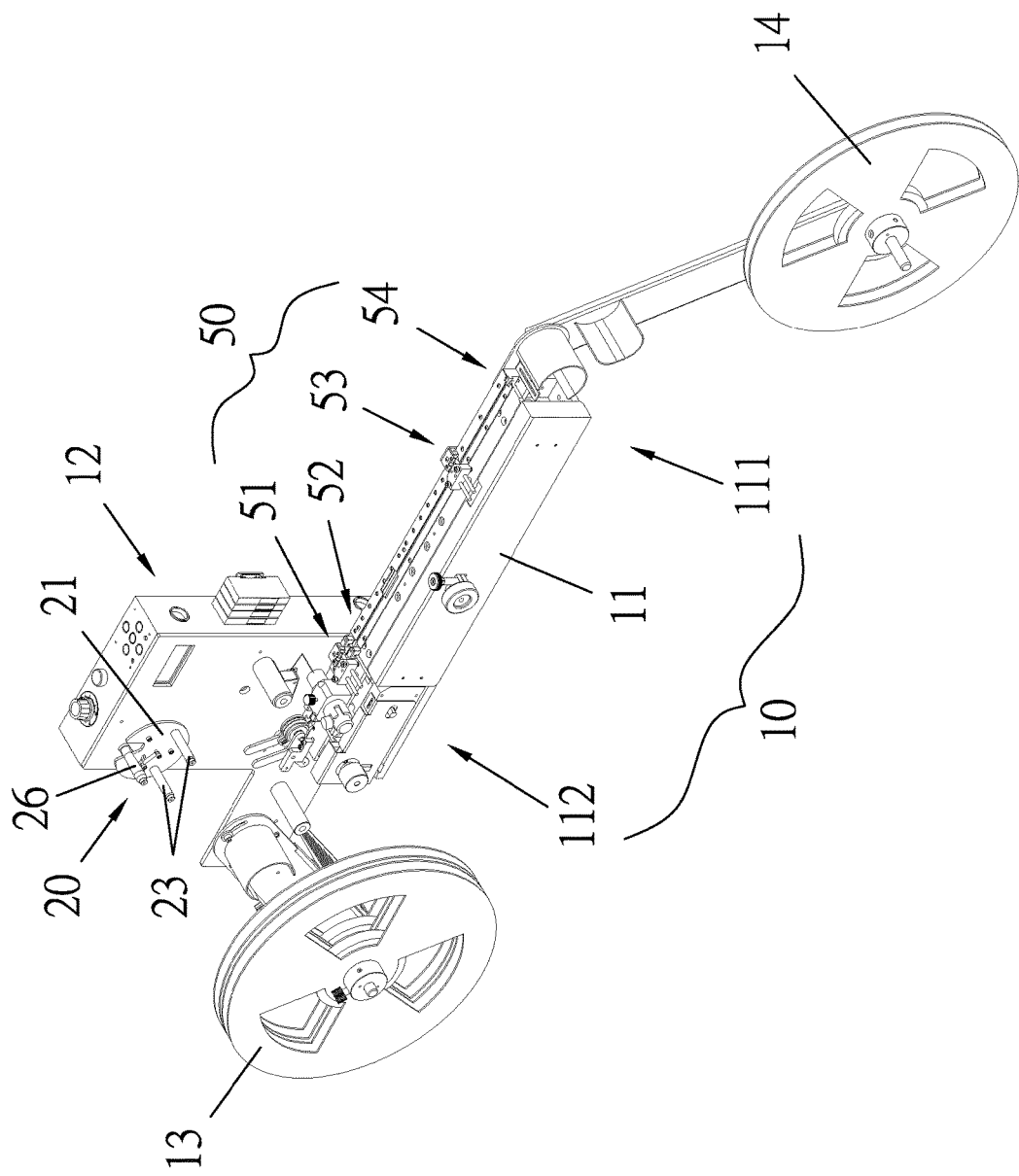
FIG. 1 is a schematically perspective view of the present invention.
Figure 7:
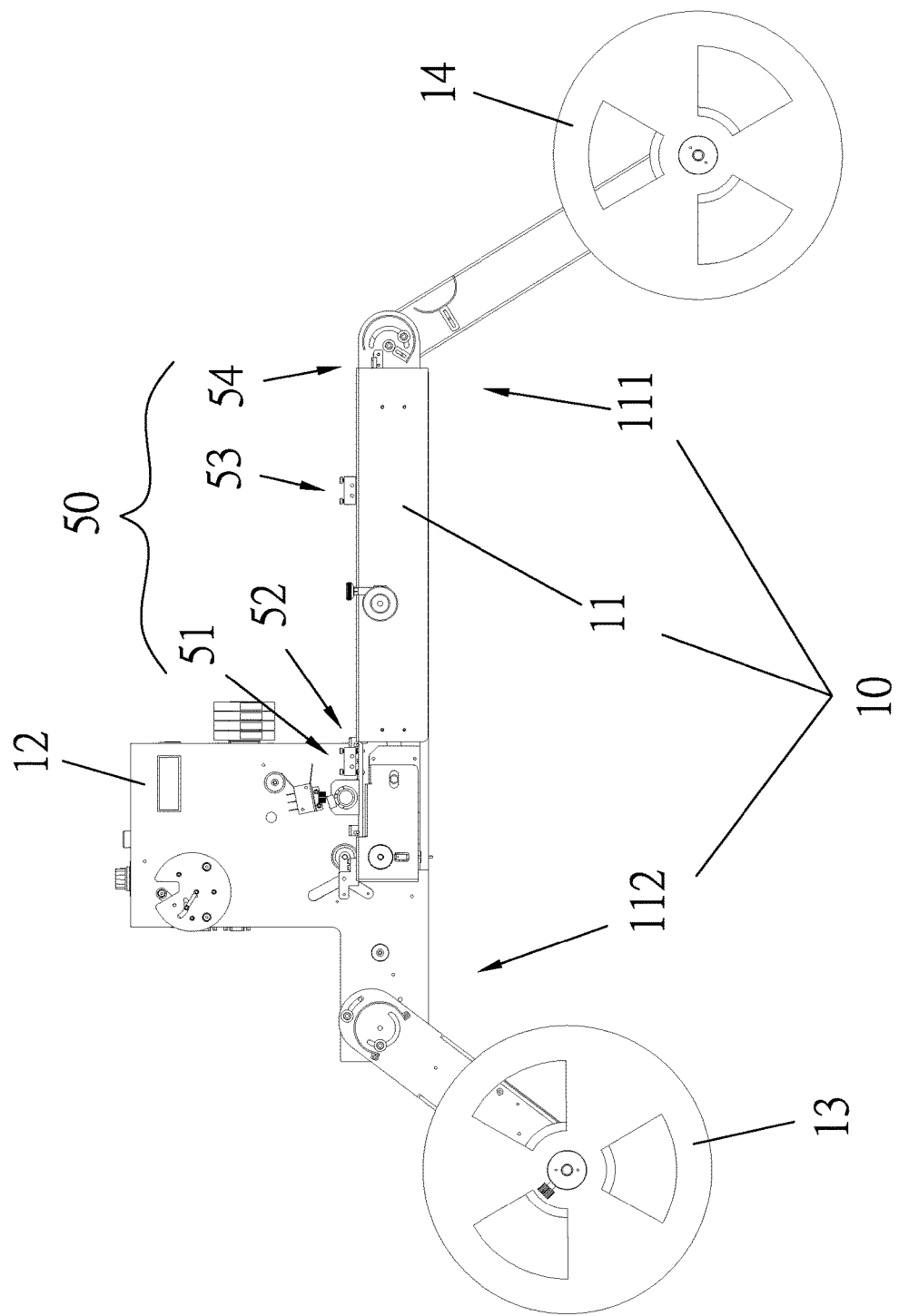
FIG. 7 is a side view of the present invention.
Figure 8:
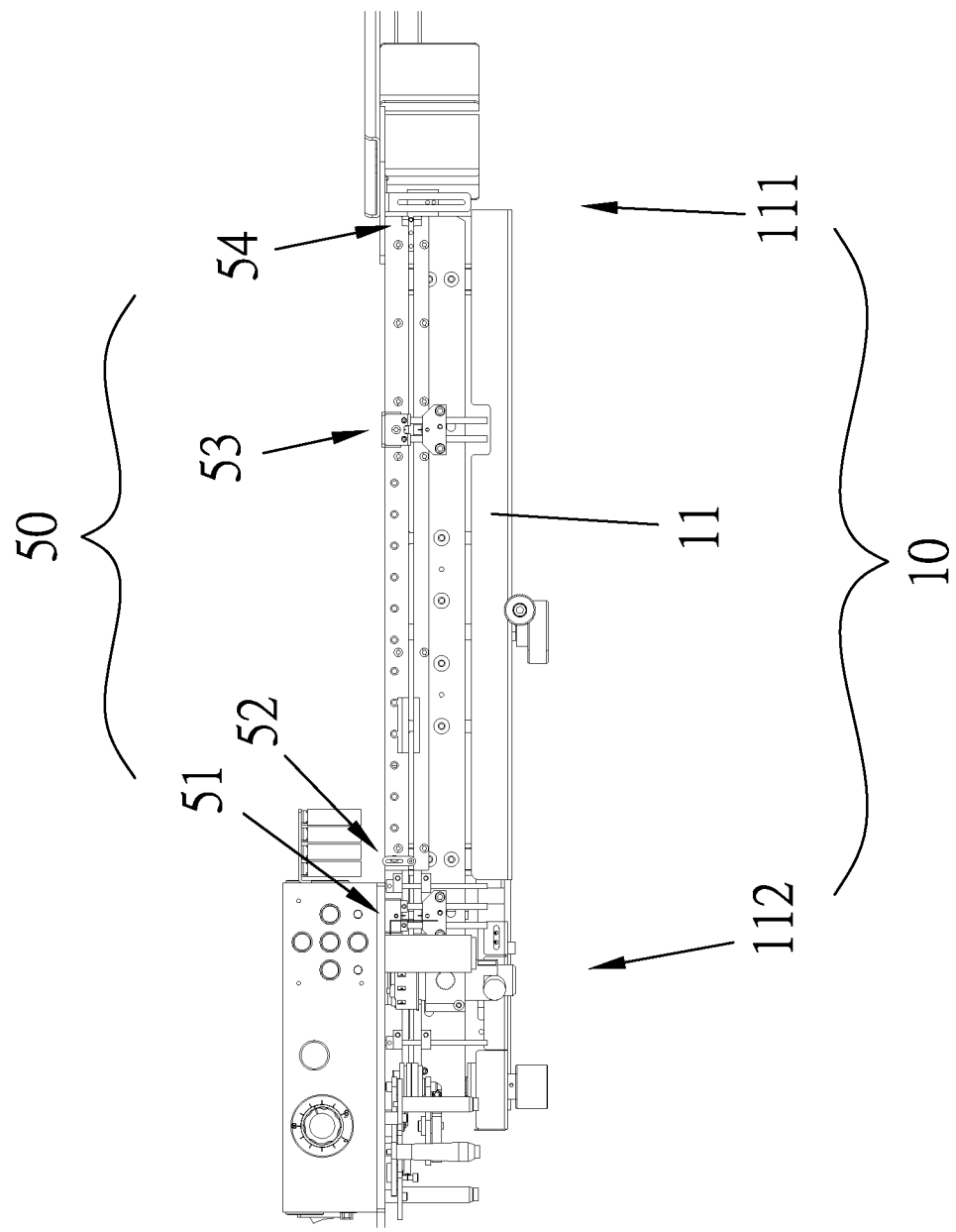
FIG. 8 is a schematically top view of the present invention.

Referring to FIGS. 1 and 7, the present invention proposes a system for sensing element adjustment and material belt detection and device, including:

a machine body 10, configured with a material conveying platform 11 having a feeding end 111 and collecting end 112, where the machine body 10 is configured with a material belt detecting device 12, a collecting disk 13 positioned on the collecting end 112, and a feeding disk 14 positioned on the feeding end 111.

a sensing system 50, configured with a first sensing element 51, second sensing element 52, third sensing element 53 and fourth sensing element 54, where the sensing system 50 may be configured on the material conveying platform 11, the first, second sensing elements 51, 52 may be positioned on the collecting end 112 of the material conveying platform 11, and the third, fourth sensing elements 53, 54 the feeding end 111 of the material conveying platform 11, as FIG. 8 shows; inside the sensing system 50 may be configured with a mean parameter module 55, which may be respectively in electric connection with the first, second, third and fourth sensing elements 51,52, 53 and 54, and seat with a warning value;

where the first, second, third and fourth sensing elements 51, 52, 53 and 54 may be a optical sensor; a set value is respectively set inside the first, second, third and fourth sensing elements 51, 52, 53 and 54, the set values allowing users to set their own parameter range; a display is respectively configured inside the first, second, third and fourth sensing elements 51, 52, 53 and 54, and the display may be an LCE or LED display, further allowing users to know the data parameters returned by each sensing element conveniently.

Figure 10:
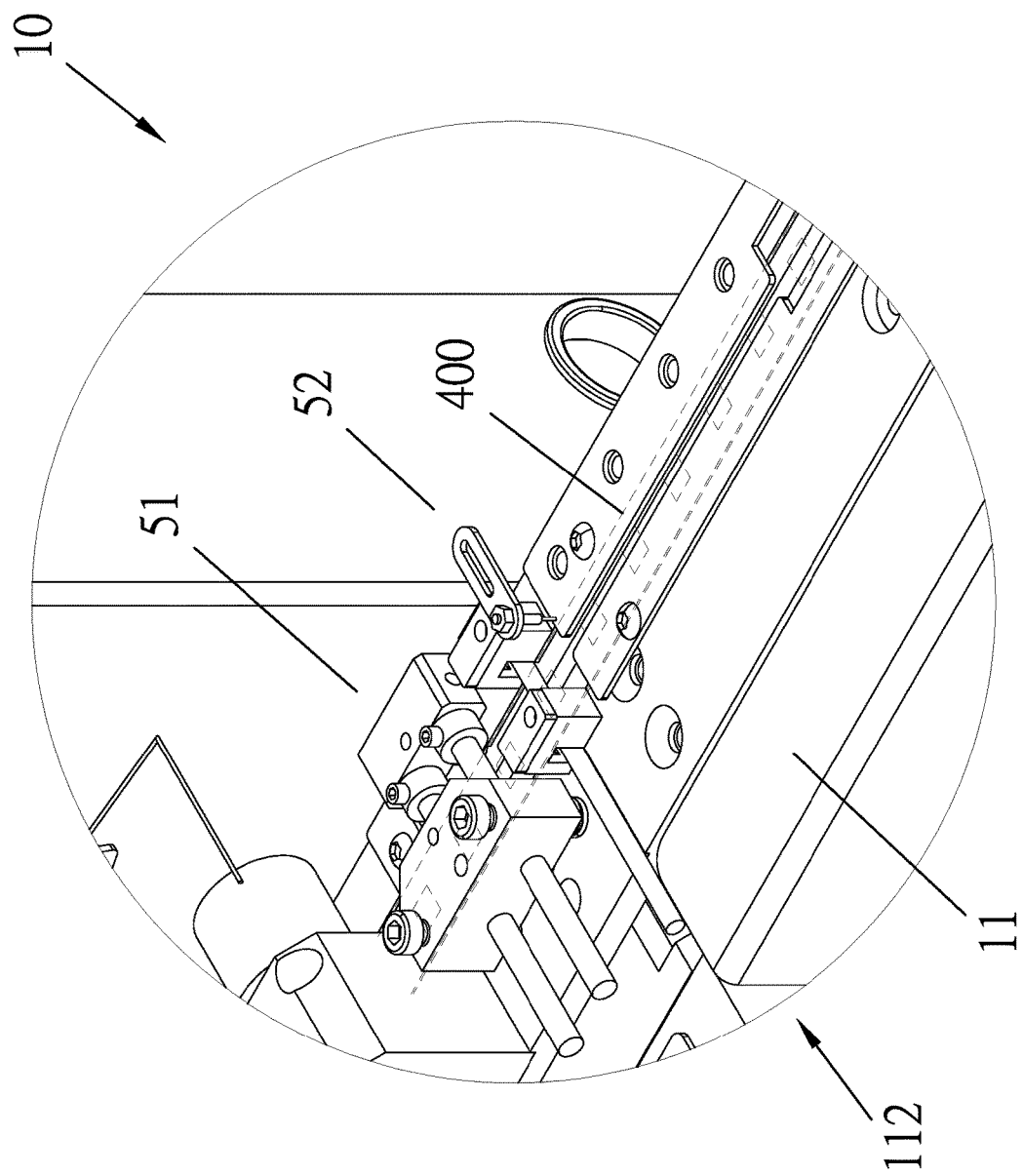
FIG. 10 is a schematically perspective view of third and fourth sensing elements according to the present invention while carrying out optical sensing.

Furthermore, referring to FIGS. 8 and 10, a material 400 is positioned on the material conveying platform 11 and between the feeding end 111 and collecting end 112 thereof in such a way that the first sensing element 51 can sense optically horizontally the level values of the material belt at the collecting end 112 and return the level value data to the display of the first sensing element 51 to output and display, the second sensing element 52 can sense optically vertically the about displacement values at the collecting end 112 and return the about displacement value data to the display of the second sensing element 52 to out and display, and the third, fourth sensing elements 53, 54 can sense optically horizontally the level values at the feeding end 111 and return the level value data to the display of the first sensing element 51 to output and display by configuring the first, second sensing elements 51, 52 of the sensing system 50 on the collecting end 112 of the material conveying platform 11, and the third, fourth sensing elements 53, 54 of the sensing system 50 on the feeding end 111 of the material conveying platform 11 as mentioned above upon the material conveying operation carried on the material conveying platform 11 by the material belt 400.

Figure 9:
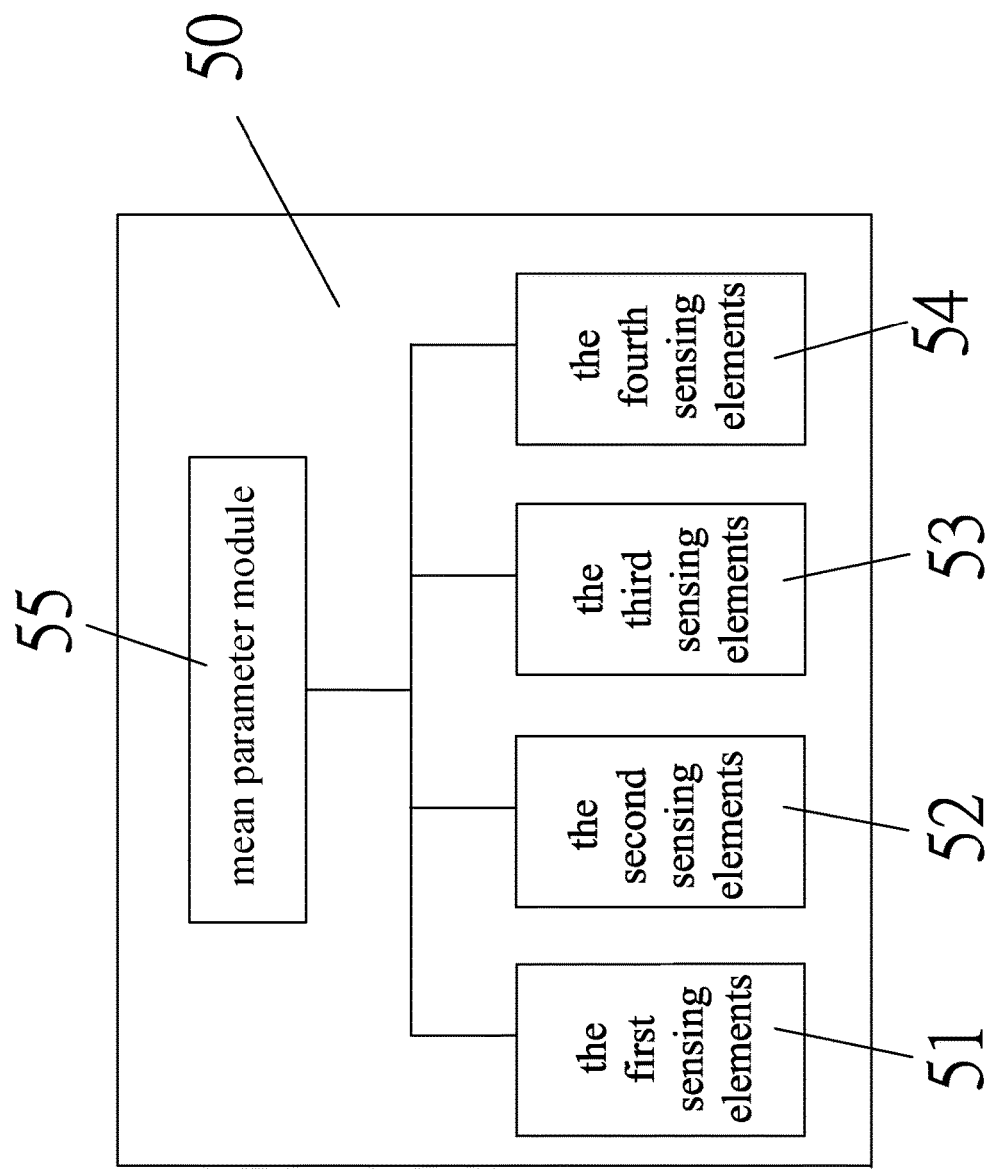
FIG. 9 is a block chart of a sensing system of the present invention'

Furthermore, referring to FIG. 9, the level value and about displacement data about the material belt 400 can be returned into the mean parameter module 55 the sensing system 50 in an optical sensing way through the first, second, third and fourth sensing elements 51, 52, 53 and 54, and the average of these data can be obtain through the mean parameter module 55; an alarm system is started through the sensing system 50 when the average value is lager than an warning value set in the mean parameter module 55, thereby achieving a warning effect.

Figure 11:
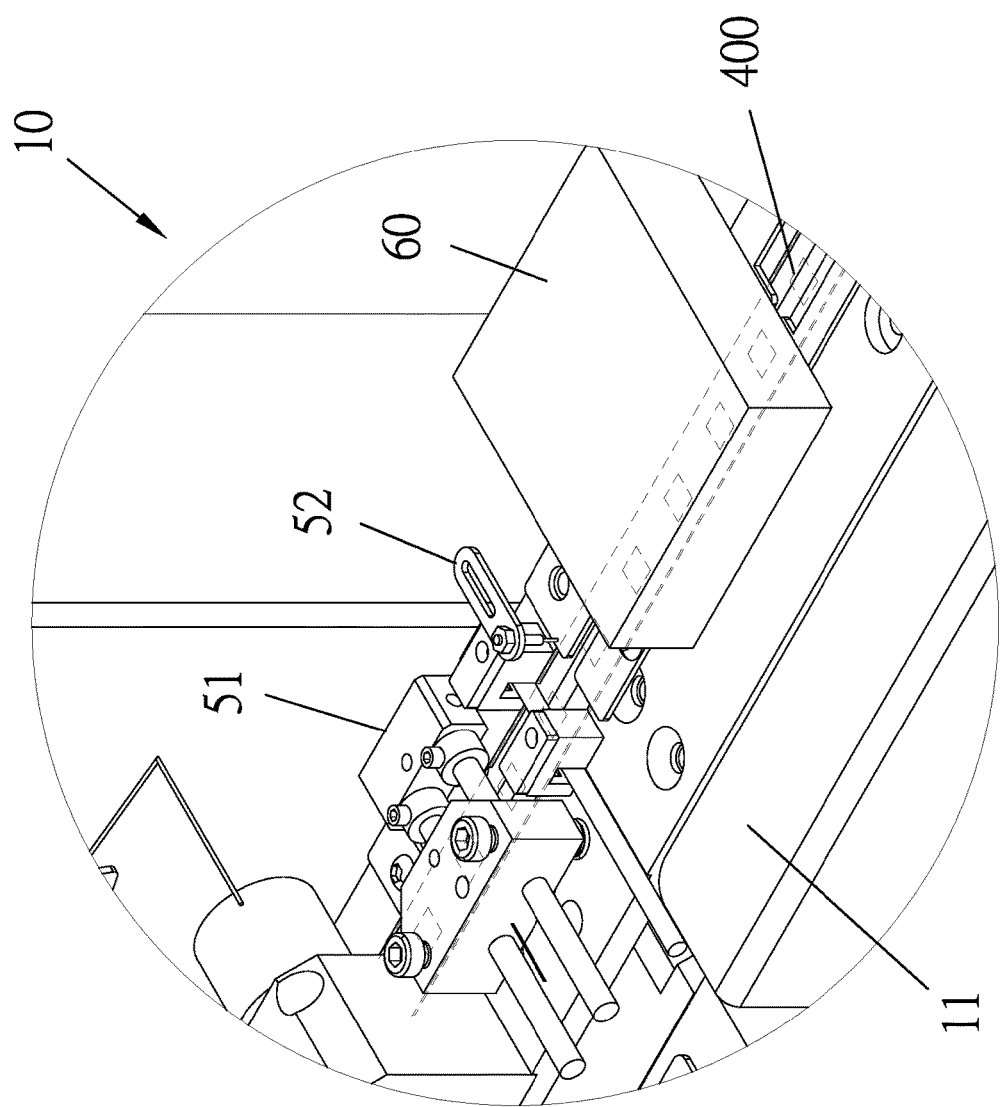
FIG. 11 is a schematically perspective view of the present invention further having a cooling module.

Referring to FIG. 11, the machine body 10 of the present invention further has a cooling module 60 configured on the material conveying platform 11 and preferably between the second and third sensing elements 52, 53, thereby cooling the material belt 400, which has a higher temperature after a printing operation is carried out by a printing device, thereby achieving an effective cooling effect.

We claim:

1. A system for sensing element adjustment and material belt detection, comprising:
   a machine body, configured with a material conveying platform configured with a feeding end and collecting end;
   an adjustable clamping device, configured on a preset position of said machine body, and having a main body, one side of said main body being indented with a notch, said main body being configured with an adjusting groove positioned at one side of said notch, said main body being configured with a first positioning rod positioned at one side of said adjusting groove, said main body being fixed with two fixing rods positioned at two respective sides of said notch, an adjusting element being coupled pivotally to said main body, said adjustable element being configured with an adjusting plate, one end of said adjustable plate being configured with an adjustable rod positioned and movable inside said notch for adjustment, another end of said adjusting plate being coupled pivotally to said main body, one side of said adjusting plate being configured with a second positioning rod having an elastic element, one end of said elastic element being connected with said second positioning rod, and another end of said elastic element being connection with said first positioning rod;
   a material disk, mount on said adjustable clamping device, said material disk being configured with a through hole allowing said adjusting rod and each said fixing rod of said adjustable clamping device to be passed through; and
   a sensing system, configured on one face of said material conveying platform, first, second, third and fourth sensing elements being configured inside said sensing system, said first and second sensing elements being positioned on said collecting end of said material conveying platform, and said third and fourth sensing elements being positioned on said feeding end thereof.

2. The system according to claim 1, wherein said adjusting rod has a head end having an inclined angle with said adjusting rod.

3. The system according to claim 2, wherein said inclined angle is in the range from 3 to 8 degrees.

4. The system according to claim 1, wherein two sides inside said notch respectively have an inclined angle, and said notch is a U-shaped cut.

5. The system according to claim 1, wherein said adjusting groove is a C-shaped groove.

6. The system according to claim 1, wherein said sensing system has a mean parameter module respectively in electric connection with said first, second, third and fourth sensing elements.

7. The system according to claim 6, wherein a warning value is set inside said mean parameter module.

8. The system according to claim 6, wherein said first sensing element senses displacement values optically horizontally, and said second sensing element senses displacement values optically vertically.

9. The system according to claim 1, wherein a cooling module is further configured on one face of said material conveying platform, and between said second and third sensing elements.

10. The system according to claim 1, wherein said adjustable clamping device is configured on one side of said machine body.

* * * * *